(12) United States Patent
Rai

(10) Patent No.: US 7,411,404 B2
(45) Date of Patent: Aug. 12, 2008

(54) APPARATUS, SYSTEM, AND METHOD FOR DETECTING AN ELECTRICAL SHORT CONDITION IN A DYNAMOELECTRIC MACHINE

(75) Inventor: Sudhanshu Rai, Uttar Pradesh (IN)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/608,389

(22) Filed: Dec. 8, 2006

(65) Prior Publication Data

US 2008/0136360 A1 Jun. 12, 2008

(51) Int. Cl.
*G01R 31/14* (2006.01)
(52) U.S. Cl. .................. 324/510; 324/772; 324/500
(58) Field of Classification Search ............ 340/648; 324/158, 510, 511, 500, 73.1; 322/83
See application file for complete search history.

(56) References Cited

U.S. PATENT DOCUMENTS

| | | | | |
|---|---|---|---|---|
| 4,164,705 | A | * | 8/1979 | Whitney et al. .......... 324/772 |
| 5,477,163 | A | | 12/1995 | Kliman |
| 5,825,597 | A | * | 10/1998 | Young ..................... 361/31 |
| 6,064,172 | A | * | 5/2000 | Kuznetsov ............... 318/716 |
| 6,483,319 | B1 | | 11/2002 | Kendig et al. |
| 6,798,210 | B2 | | 9/2004 | Goodrich et al. |
| 6,882,173 | B1 | | 4/2005 | Nelson et al. |
| 6,911,838 | B2 | | 6/2005 | Rao et al. |
| 6,979,975 | B1 | * | 12/2005 | Kinpara et al. ...... 318/400.02 |
| 2004/0189279 | A1 | | 9/2004 | Rao et al. |
| 2005/0068058 | A1 | | 3/2005 | Nelson et al. |
| 2005/0218907 | A1 | * | 10/2005 | Lee et al. ................. 324/551 |

OTHER PUBLICATIONS

The New Method On Rotor Winding Inter Turn Short-Circuit Fault Measure of Turbine Generator, Li Yonggang; Zhao Hua; Li Heming; Electric Matchines and Drives Conference, 2003. IEMDC'03. IEEE International, vol. 3, Jun. 1-4, 2003; pp. 1483-1487 vol. 3.
The Diagnosis Method of Generator Rotor Winding Inter Turn Short Circuit Fault Based On Excitation Current Harmonics, Wan Shuting; Li Heming; Li Yonggang; Wang Yi; Power Electronics and Drive Systems, 2003. PEDS 2003. The Fifth International Conf on vol. 2, Nov. 17-20, 2003, pp. 1669-1673, vol. 2.
Inter Turn Short Circuit Fault Research on Generator Rotor Windings, Li Yonggang; Li Heming; Zhu Ling; Zhao Hua; Electrical Machines and SYstems, 2001. ICEMS 2001. Proceedings of the Fifth International Conference on vol. 1, Aug. 18-20, 2001, pp. 357-360, vol. 1.

* cited by examiner

*Primary Examiner*—Diego Gutierrez
*Assistant Examiner*—Benjamin M Baldridge
(74) *Attorney, Agent, or Firm*—Ann M. Agosti

(57) ABSTRACT

A system, apparatus, and method (10) for detecting an electrical short condition in a dynamoelectric machine are described. The method includes determining an operating parameter of a dynamoelectric machine (14) responsive to at least one output signal of the dynamoelectric machine and providing a transfer function (16) for predicting a field current of dynamoelectric machine. The method also includes obtaining a value for a predicted field current (18) of the dynamoelectric machine from the transfer function and the operating parameter and identifying a shorted turn condition of the dynamoelectric machine responsive to a difference between the value of the predicted field current and a value of an actual field current of the dynamoelectric machine (24).

20 Claims, 5 Drawing Sheets

| Unit No. | Generator Type | Mean (% Deviation) | St. Dev. | 99% CI for Mean Deviation | | Field Health |
|---|---|---|---|---|---|---|
| | | | | Lower | Upper | |
| 297153 | 731 | 0.465 | 0.345 | −0.422 | 1.353 | GOOD |
| 297154 | 731 | 1.112 | 0.308 | 0.319 | 1.904 | GOOD |
| 297667 | 741 | −0.438 | 0.892 | −2.734 | 1.859 | GOOD |
| 297666 | 741 | −0.134 | 0.838 | −2.291 | 2.023 | GOOD |
| 297571 | 741 | 0.222 | 0.362 | −0.712 | 1.155 | GOOD |
| 297570 | 741 | −0.576 | 0.568 | −2.038 | 0.886 | GOOD |
| 297346 | 741 | 0.415 | 0.658 | −1.279 | 2.109 | GOOD |
| 297345 | 741 | −0.441 | 0.584 | −1.944 | 1.062 | GOOD |
| 297198 | 741 | 0.268 | 0.426 | −0.829 | 1.365 | GOOD |
| 297197 | 741 | 0.341 | 0.315 | −0.471 | 1.154 | GOOD |
| 297600 | 753 | 1.601 | 0.820 | −0.511 | 3.714 | GOOD |
| 297601 | 753 | 1.231 | 0.755 | −0.715 | 3.177 | GOOD |
| 297300 | 7FH2 | 0.566 | 1.246 | −2.643 | 3.774 | GOOD |
| 297302 | 7FH2 | 1.292 | 1.356 | −2.200 | 4.784 | GOOD |
| 297303 | 7FH2 | 0.651 | 1.463 | −3.117 | 4.418 | GOOD |
| 297301 | 7FH2 | 9.825 | 1.130 | 6.915 | 12.735 | Shorted Turn |

FIG. 7

APPARATUS, SYSTEM, AND METHOD FOR DETECTING AN ELECTRICAL SHORT CONDITION IN A DYNAMOELECTRIC MACHINE

FIELD OF THE INVENTION

The present disclosure relates generally to dynamoelectric machines and, more particularly, to detection of an electrical short condition in a winding of a dynamoelectric machine excited by a direct current (DC) voltage.

BACKGROUND OF THE INVENTION

Certain types of dynamoelectric machines, such as DC machines or synchronous machines, may include a field winding excited by a DC voltage. A synchronous machine is a doubly excited dynamoelectric machine wherein a rotor carries a field winding excited by a DC source. The current in the field winding, or field current, depends on an armature current and a grid voltage. An excitation controller provides the control of the field current by controlling a voltage across the field winding. The purpose of field current to is to produce a flux that links the stator winding for inducing an electromotive force (emf) for generating electrical power.

FIG. 1 illustrates a typical phasor diagram of a salient pole synchronous machine where Vt and Ia represent the stator voltage and stator current, respectively, during operation, $\delta$ represents a power angle, and $\phi$ represents a power factor angle. Id and Iq represent respective current components along direct axis (d axis) and quadrature axis (q axis). Xd and Xq represent the synchronous reactance along the d axis and the q axis, respectively. Xl represents leakage reactance, Em represents a total emf behind the leakage reactance, and E represents the total emf induced at a certain operating condition.

Over time, dynamoelectric machines, such as generators used to produce electricity, may become increasingly susceptible to field winding short conditions, such as shorted turns, that detrimentally affect operation of the machine. Conventionally, shorted turns are identified by performing periodic testing of the generator while operating at different loads. However, such testing may require the generator to be operated in a suboptimal mode or be taken off-line entirely while performing testing. On-line testing for shorted turns may be accomplished by monitoring a flux density provided by a flux probe inserted into an air gap between a rotor and an armature of the generator. Flux probe testing may require monitoring the generator over an extending period of time and over a wide variety of load ranges. However, a flux probe monitoring system may be prohibitively expensive and interpretation of the resulting flux density data is relatively subjective.

BRIEF DESCRIPTION OF THE INVENTION

In an example embodiment, the invention includes a method for detecting an electrical short condition in a dynamoelectric machine. The method includes determining an operating parameter of a dynamoelectric machine responsive to at least one output signal of the dynamoelectric machine and providing a transfer function for predicting a field current of dynamoelectric machine. The method also includes obtaining a value for a predicted field current of the dynamoelectric machine from the transfer function and the operating parameter and identifying a shorted turn condition of the dynamoelectric machine responsive to a difference between the value of the predicted field current and a value of an actual field current of the dynamoelectric machine.

In another example embodiment, the invention includes an apparatus for detecting an electrical short condition in a dynamoelectric machine. The apparatus includes a processor for receiving at least one output signal of a dynamoelectric machine and an actual field current of the dynamoelectric machine. The apparatus also includes programmed logic operable with the processor for determining an operating parameter of a dynamoelectric machine responsive to at least one output signal of the dynamoelectric machine, providing a transfer function for predicting a field current of dynamoelectric machine, obtaining a value for a predicted field current of the dynamoelectric machine from the transfer function and the operating parameter, and identifying a shorted turn condition of the dynamoelectric machine responsive to a difference between the value of the predicted field current and a value of an actual field current of the dynamoelectric machine.

In another example embodiment, the invention includes a system for detecting an electrical short condition in a dynamoelectric machine. The system includes an operating parameter calculator for determining an operating parameter of a dynamoelectric machine responsive to at least one output signal of the dynamoelectric machine, and a function generator for providing a transfer function relating field current to an electromotive force produced by the dynamoelectric machine. The system also includes a field current predictor for obtaining a value of a predicted field current of the dynamoelectric machine from the transfer function and the operating parameter and a residual analyzer for determining a difference between the value of the predicted field current and a value of an actual field current of the dynamoelectric machine.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 7 shows a table of example validation results using an embodiment of the current invention to identify a generator having a shorted turn condition.

DETAILED DESCRIPTION OF THE INVENTION

Figure 1:
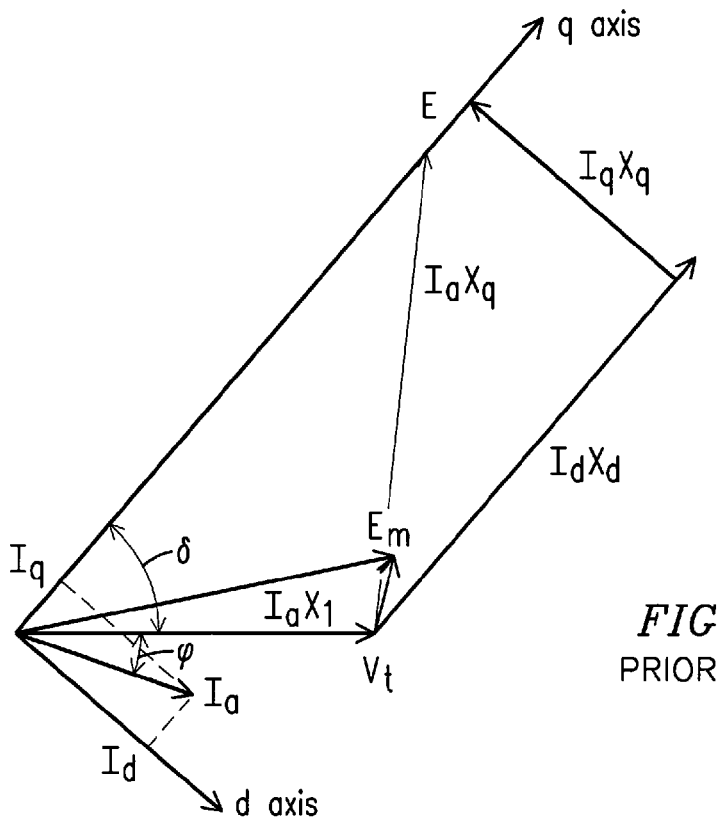
FIG. 1 shows a typical phasor diagram of a salient pole synchronous machine.
Figure 2:
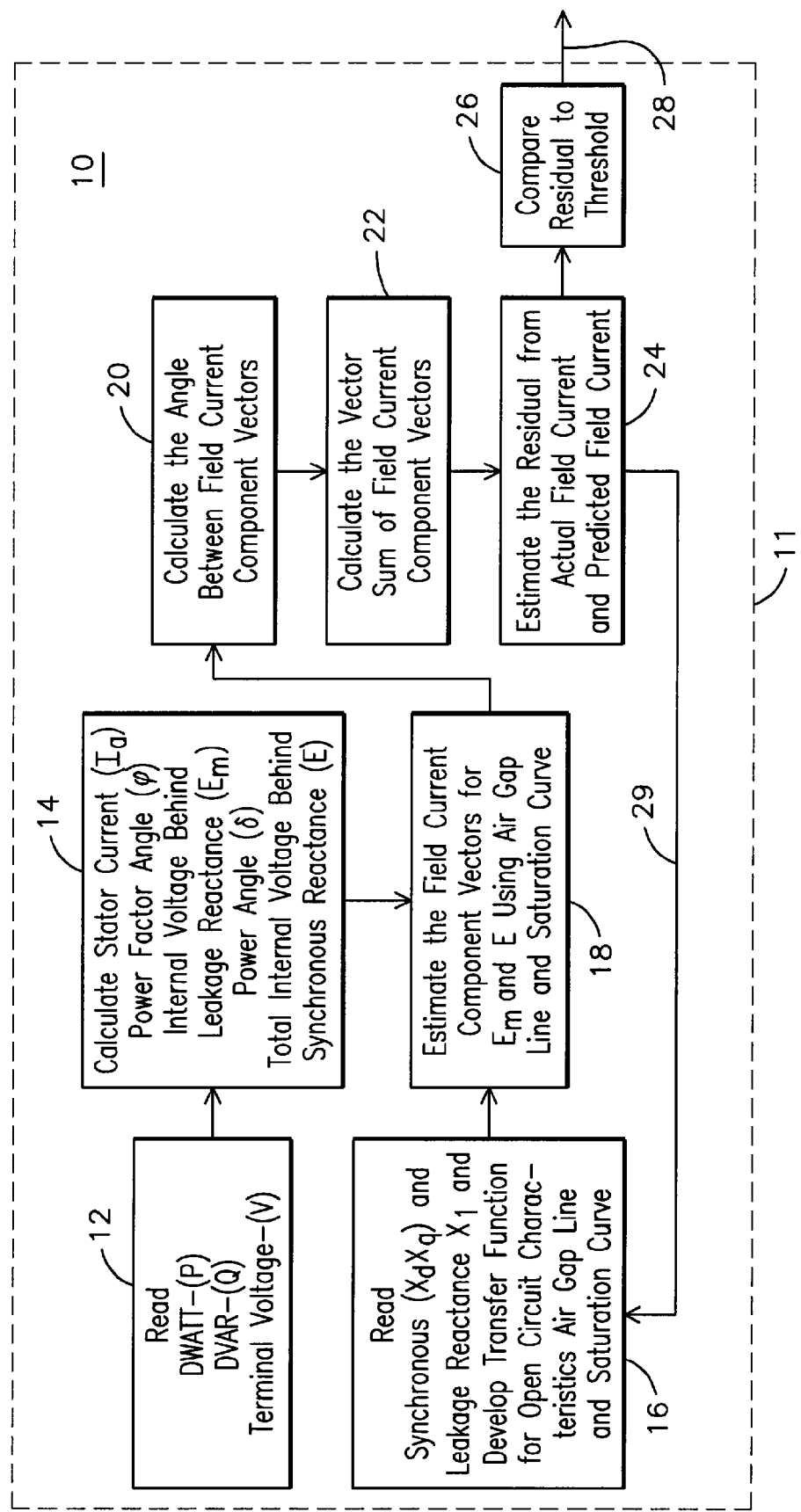
FIG. 2 shows a flow diagram of an example embodiment of a method for detecting an electrical short condition in a dynamoelectric machine.

An innovative method for detecting an electrical short condition in a winding of a dynamoelectric machine excited by a direct current (DC) voltage includes predicting a field current of the machine based on a machine operating parameter and comparing the predicted field current to an actual field current of the machine to determine a difference indicative of a potential electrical short condition. FIG. 2 shows a flow diagram of an example embodiment of a method 10 for detecting an electrical short condition in a dynamoelectric machine excited by a direct current (DC) voltage, such as a synchronous generator. The method 10 may include determining an operating parameter of a dynamoelectric machine responsive to at least one output signal of the dynamoelectric machine. For example, the method 10 may include reading an output signal 12, such as one or more of an active power output (P) of the dynamoelectric machine, reactive power output (Q) of the dynamoelectric machine, and a voltage output (V) of the dynamoelectric machine. In an example embodiment, one or more output signals may be provided by an online monitor monitoring an operating condition of the dynamoelectric machine. Based on one or more of the output signals, the method 10 may include calculating various operating parameters of the dynamoelectric machine 14, such as stator current (Ia), power factor angle ($\phi$), internal voltage behind leakage reactance (Em), power angle ($\delta$), and total internal voltage behind synchronous reactance (E). The operating parameters may be calculated based on the phasor diagram of FIG. 1. For example, E may be calculated using the equation 1:

$$E = \sqrt{\begin{array}{l}(Vt + I_a X_d \mathrm{Sin}(\delta + \phi)\mathrm{Cos}\delta)^2 + \\ (I_a X_q \mathrm{Cos}(\delta + \phi) + \\ I_a X_d \mathrm{Sin}(\delta + \phi)\mathrm{Sin}\delta)^2\end{array}} \quad ; \qquad 1)$$

Em may be calculated using the equation 2:

$$E_m = \sqrt{(V\mathrm{Cos}\phi)^2 + (V\mathrm{Sin}\phi + I_a X_1)^2} ; \text{ and} \qquad 2)$$

$\delta$ may be calculated using the equation 3:

$$\delta = \frac{V\mathrm{Sin}\phi + I_a X_q}{V\mathrm{Cos}\phi}. \qquad 3)$$

The method 10 may also include providing one or more transfer functions, such as a transfer function relating field current to an electromotive force produced by the dynamoelectric machine. This step may include reading synchronous reactances Xd and Xq and leakage reactance X1 output signals of the dynamoelectric machine, and then generating the transfer function based on these output signals 16. Because machine output parameters, such as synchronous reactances Xd and Xq and leakage reactance X1 may deviate during on-line operation at different loads and power factors, these on-line output parameters may be useful for generating a transfer function that reflects on-line operating conditions. In an example embodiment, the transfer function may be based on historical output parameter data for at least one of the dynamoelectric machine and other dynamoelectric machines of the same type. For example, if output parameters of a single dynamoelectric machine are being monitored, generation of the transfer function may be performed off-line. If output parameters for a fleet of same-type dynamoelectric machines are available, generation of the transfer function may be performed on-line.

Figure 3:
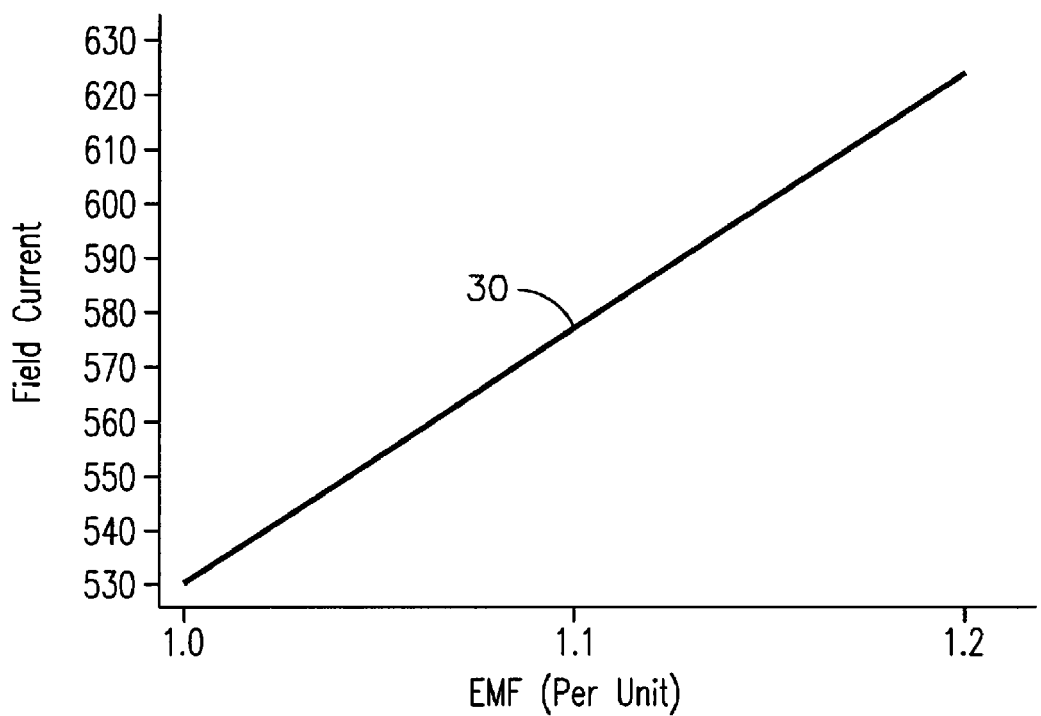
FIG. 3 shows an example air gap transfer function relating field current to electromotive force.
Figure 4:
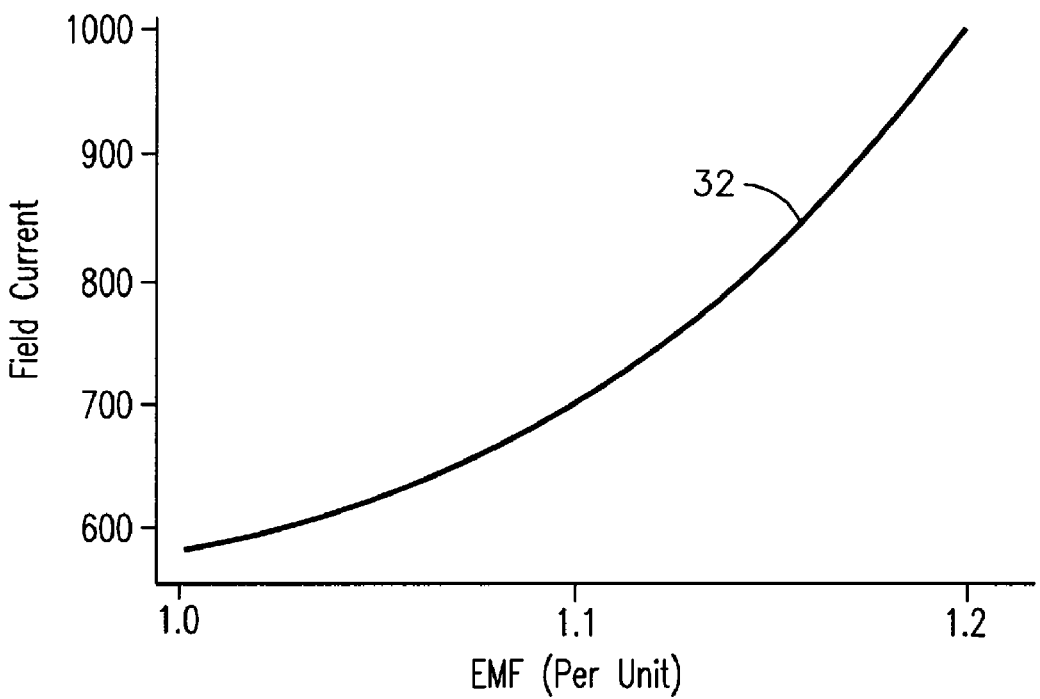
FIG. 4 shows an example magnetic saturation transfer function relating field current to electromotive force.

In another example embodiment, the transfer function may include an air gap transfer function 30 and a magnetic saturation transfer function 32 as shown in FIGS. 3 and 4, respectively. The example air gap transfer function 30 of FIG. 3 can be defined by the equation $y=73.3704+456.276x$. The example magnetic saturation transfer function 32 of FIG. 4 can be defined by the equation $y=-4441.08+19904.7x-31057.6x^2+12086.43x^3$. Estimation of the coefficients of the respective transfer functions equations may be initially determined based on historical dynamoelectric machine operation information. In another aspect of the invention, estimation of the coefficients may be estimated so as to minimize an error in a difference between a predicted field current and an actual field current of the dynamoelectric machine.

Figure 5:
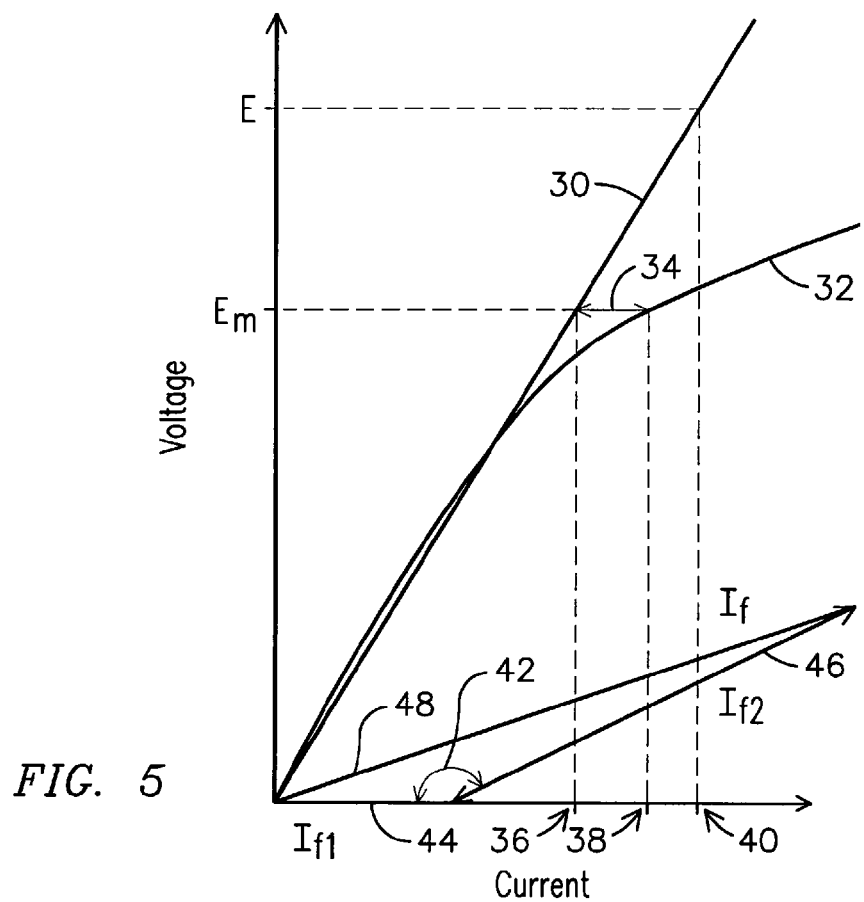
FIG. 5 shows a diagram useful in understanding how a predicted field current may be determined.

After generating the transfer function(s), the method 10 may then include determining a predicted value of the field current of the dynamoelectric machine from the transfer function(s) and the operating parameters. For example, the value of the predicted field current may be derived 18 based on field current vector components corresponding to the determined operating parameters E and Em in relation to the air gap transfer function 30 and the magnetic saturation transfer function 32. As shown in the diagram of FIG. 5, a first field current vector 44 may be derived based on a difference 34 between a value 36 of field current for the air gap transfer function and a value 38 of field current for the magnetic saturation transfer function at the determined Em. A second field current vector 46 may be derived based on a value of field current for the air gap transfer function at the determined E. An angle 42 between the first field current vector 44 and second field current vector 46, may then be calculated 20 using, for example, equation 4:

$$\angle 42 = \mathrm{Tan}^{-1}\left(\frac{\frac{V}{\sqrt{3}}\mathrm{Sin}(-\delta) + I_a X_1}{\frac{V}{\sqrt{3}}\mathrm{Cos}\delta}\right) + \phi \qquad 4)$$

Using the angle 42 between the first field current vector 44 and second field current vector 46, a resultant vector 48 may be computed 22 using vector addition to determine the value of the predicted field current.

After the value of the predicted field current is determined, the method 10 may include identifying a shorted turn condition of the dynamoelectric machine responsive to a difference between the value of the predicted field current and a value of the actual field current of the dynamoelectric machine 24. For example, a statistical residual, such as a mean difference between the value of the predicted field current and the value of the actual field current over a certain time period may be used to identify a shorted turn condition. The difference may be compared to a threshold value 26, and when the difference exceeds the threshold value, a shorted turn indication 28, such as a shorted turn alarm, may be generated. In an example embodiment, a 5% difference may be used as the threshold value for indicating a shorted turn error.

In another example embodiment of the invention, the method 10 may include modifying one or more transfer functions, such as modifying the coefficients of an air gap transfer function and a magnetic saturation transfer function, responsive to a residual error between the value of the predicted field current and the value of the actual field current as indicated by feedback path 29 of FIG. 2. For example, the reactances and transfer functions established in step 16 may be modified based on the residual error to more accurately determine a predicted field current. Typically, in a shorted turn fault condition, the residual error is typically either monotonically increasing as function of time or constant over the time. If a residual error is not showing either of these behaviors, then the transfer function coefficients may need to be optimized to minimize the residual error.

The steps for performing the above described method to detect an electrical short condition may be embodied in a processor 11 encoded with programmed logic for performing the steps. Processor 11 may take any form known in the art, for example, an analog or digital microprocessor or computer, and it may be integrated into or combined with an online system monitor for monitoring operation of the dynamoelectric machine.

Figure 6:
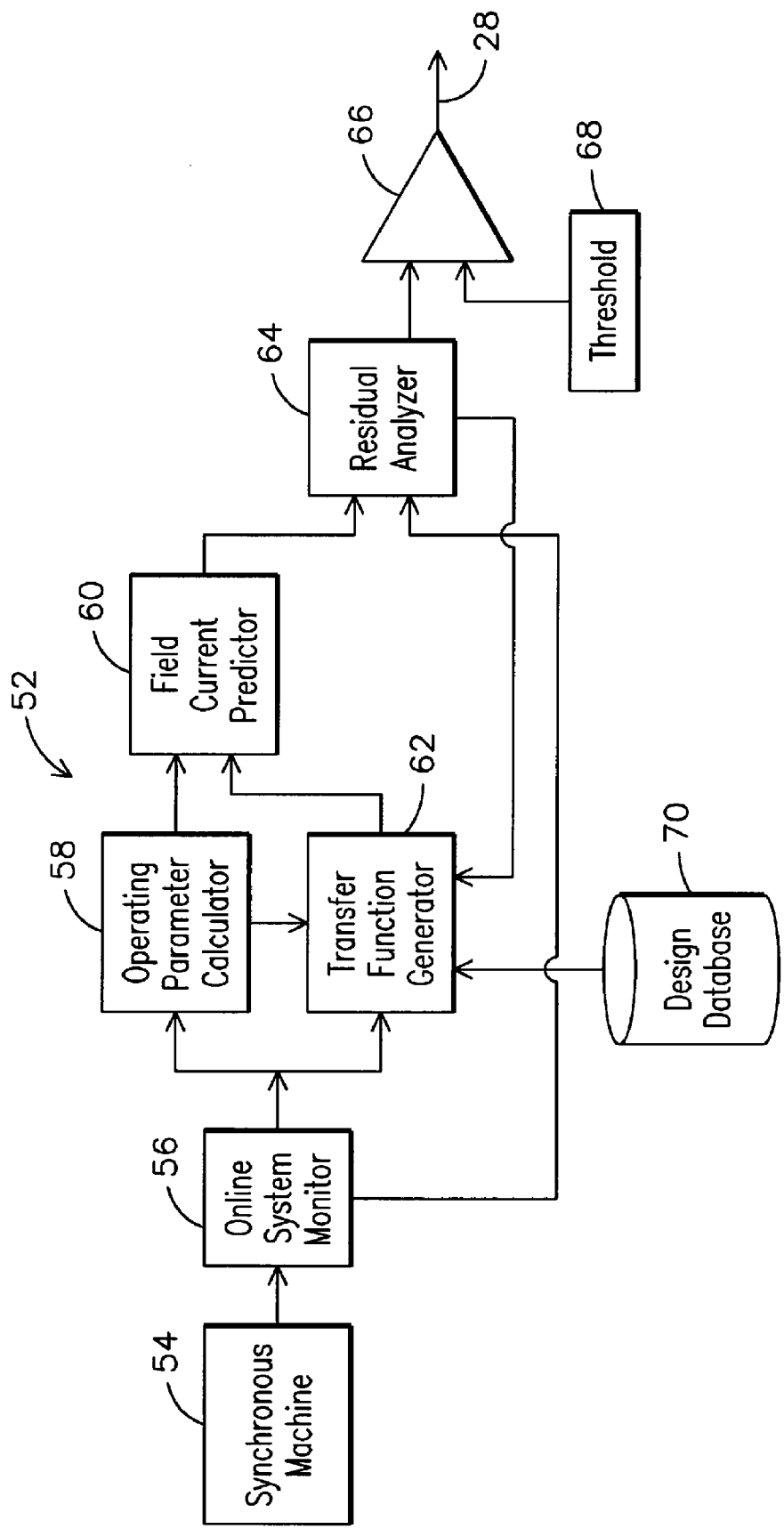
FIG. 6 shows a functional block diagram of an example system for detecting an electrical short condition in a dynamoelectric machine.

FIG. 6 shows a functional block diagram of an example system 52 for detecting an electrical short condition in a dynamoelectric machine. In an embodiment, the system 52 may be configured to perform the previously described method steps. The system 52 may include an operating parameter calculator 58 for determining an operating parameter of a dynamoelectric machine 54 responsive to at least one output signal of the dynamoelectric machine 54. The operating parameter calculator 58 may receive dynamoelectric machine output signals, such as active power output, reactive power output, and a voltage output of the dynamoelectric machine 54 via, for example, an on-line system monitor 56. The system 52 may also include a transfer function generator 62 for generating a transfer function relating field current to an electromotive force produced by the dynamoelectric machine 54. The transfer function generator 62 may provide one or more transfer functions based on dynamoelectric machine output signals, dynamoelectric machine operating parameters and/or dynamoelectric machine design parameters available, for example, in a design database 70 accessible by the transfer function generator 62. The design database 70 may provide dynamoelectric machine design parameters in the form of dynamoelectric machine transfer function information for the dynamoelectric machine being monitored and/or for a fleet of like machines.

The system 52 may further include a field current predictor 60 for determining a predicted field current of the dynamoelectric machine responsive, for example, to the operating parameter and the transfer function. The field current predictor 60 may be configured for determining field current component vectors for an air gap and saturation transfer functions, respectively, and vector adding the two components to determine a resultant predicted field current.

The system 52 may also include a residual analyzer 64 for receiving a value of the predicted field current and the value of the actual field current of the dynamoelectric machine, such as from the on-line system monitor 56, and determine a difference between the value of the predicted field current and the value of the actual field current of the dynamoelectric machine 54. The residual analyzer 64 may use statistical techniques to determine the difference, such as be determining a mean difference between the value of the predicted field current and the value of the actual field current. The difference may be supplied to a comparator 66 for comparing the difference to a threshold 68. When the difference exceeds the threshold, the comparator 66 may be configured for generating a shorted turn indication 28, such as a shorted turn alarm.

In another example embodiment, the residual analyzer 64 may be further configured for generating an error output indicative of an error in the value of the predicted field current. The error output may be fed back to the transfer function generator 62 to be used for modifying the one or more transfer functions responsive to the error output generated by the residual analyzer 64.

FIG. 7 shows a table 50 of example validation results using an embodiment of the current invention to identify a generator having a shorted turn condition. The data used in the table 50 was collected over a 12 hour period at 5 minute intervals. As shown in the table, generator unit 297301 was identified as a shorted turn rotor as indicated by exhibiting an actual field current deviation of 9.8% from a predicted field current generated according to an embodiment of the present invention.

Based on the foregoing specification, the invention may be implemented using computer programming or engineering techniques including computer software, firmware, hardware or any combination or subset thereof, wherein the technical effect is to detect an electrical short condition in a dynamoelectric machine. Any such resulting program, having computer-readable code means, may be embodied or provided within one or more computer-readable media, thereby making a computer program product, i.e., an article of manufacture, according to the invention. The computer readable media may be, for instance, a fixed (hard) drive, diskette, optical disk, magnetic tape, semiconductor memory such as read-only memory (ROM), etc., or any transmitting/receiving medium such as the Internet or other communication network or link. The article of manufacture containing the computer code may be made and/or used by executing the code directly from one medium, by copying the code from one medium to another medium, or by transmitting the code over a network.

One skilled in the art of computer science will easily be able to combine the software created as described with appropriate general purpose or special purpose computer hardware, such as a microprocessor, to create a computer system or computer sub-system embodying the method of the invention. An apparatus for making, using or selling the invention may be one or more processing systems including, but not limited to, a central processing unit (CPU), memory, storage devices, communication links and devices, servers, I/O devices, or any sub-components of one or more processing systems, including software, firmware, hardware or any combination or subset thereof, which embody the invention.

While certain embodiments of the present invention have been shown and described herein, such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for detecting an electrical short condition in a dynamoelectric machine comprising:
   determining an operating parameter of a dynamoelectric machine responsive to at least one output signal of the dynamoelectric machine;
   providing a transfer function for predicting a field current of the dynamoelectric machine;
   obtaining a value for a predicted field current of the dynamoelectric machine from the transfer function and the operating parameter based solely on residual error minimization of the transfer function and a vector sum of two-field current components; and
   identifying a shorted turn condition of the dynamoelectric machine responsive to a difference between the value of the predicted field current and a value of an actual field current of the dynamoelectric machine.

2. The method of claim 1, wherein the output signal comprises at least one of active power output of the dynamoelectric machine, reactive power output of the dynamoelectric machine, and a voltage output of the dynamoelectric machine.

3. The method of claim 2, wherein the operating parameter includes at least one of stator current, power factor angle, internal voltage behind leakage reactance, power angle, and internal voltage behind synchronous reactance.

4. The method of claim 3, wherein the transfer function is based on historical operating parameter data for at least one of the dynamoelectric machine and other dynamoelectric machines of the same type.

5. The method of claim 3, wherein the transfer function comprises a relationship between field current and electromotive force.

6. The method of claim 5, wherein the transfer function comprises an air gap transfer function and a magnetic saturation transfer function.

7. The method of claim 6, wherein obtaining a value for the predicted field current further comprises deriving a first field current vector responsive to a difference between a value of field current for the air gap transfer function and a value of field current for the magnetic saturation transfer function at the determined internal voltage behind leakage reactance.

8. The method of claim 7, wherein obtaining a value for the predicted field current further comprises deriving a second field current vector responsive to a value of field current for the air gap transfer function at the determined internal voltage behind synchronous reactance.

9. The method of claim 8, further comprising calculating a resultant vector of the first field current vector and the second field current vector to obtain the predicted field current.

10. The method of claim 1, further comprising identifying a prediction error responsive to the difference between the between the value of the predicted field current and the value of an actual field current of the dynamoelectric machine.

11. The method of claim 10, further comprising modifying the transfer function responsive to the prediction error.

12. The method of claim 1, wherein the difference between the value of the predicted field current and the value of an actual field current of the dynamoelectric machine comprises a mean difference.

13. The method of claim 1, wherein the output signal is provided by an online operating system monitoring an output of the dynamoelectric machine.

14. An apparatus for detecting an electrical short condition in a dynamoelectric machine comprising:
 a processor for receiving at least one output signal of a dynamoelectric machine and an actual field current of the dynamoelectric machine; and
 programmed logic operable with the processor for:
  determining an operating parameter of the dynamoelectric machine responsive to at least one output signal of the dynamoelectric machine;
  providing a transfer function for predicting a field current of the dynamoelectric machine;
  obtaining a value for a predicted field current of the dynamoelectric machine from the transfer function and the operating parameter based solely on residual error minimization of the transfer function and a vector sum of two-field current components; and
  identifying a shorted turn condition of the dynamoelectric machine responsive to a difference between the value of the predicted field current and a value of an actual field current of the dynamoelectric machine.

15. A system for detecting an electrical short condition in a dynamoelectric machine comprising:
 an operating parameter calculator for determining an operating parameter of a dynamoelectric machine responsive to at least one output signal of the dynamoelectric machine;
 a function generator for providing a transfer function relating field current to an electromotive force produced by the dynamoelectric machine;
 a field current predictor for obtaining a value of a predicted field current of the dynamoelectric machine from the transfer function and the operating parameter based solely on residual error minimization of the transfer function and a vector sum of two-field current component; and
 a residual analyzer for determining a difference between the value of the predicted field current and a value of an actual field current of the dynamoelectric machine.

16. The system of claim 15, further comprising an online system monitor for monitoring an output of the dynamoelectric machine and providing the output signal to the operating parameter calculator.

17. The system of claim 15, further comprising a dynamoelectric machine design database for providing dynamoelectric machine transfer function information to the function generator for generating the transfer function.

18. The system of claim 15, further comprising a comparator for generating a short condition indication when the difference between the value of the predicted field current and the value of the actual field current exceeds a threshold value.

19. The system of claim 15, wherein the residual analyzer is further configured for generating an error output indicative of an error in the value of the predicted field current.

20. The system of claim 19, wherein the transfer function generator is configured for generating the transfer function responsive to the error output of the residual analyzer.

* * * * *